US009255014B2

(12) United States Patent
Shimozaki et al.

(10) Patent No.: US 9,255,014 B2
(45) Date of Patent: Feb. 9, 2016

(54) METHOD FOR PRODUCING THERMOELECTRIC CONVERSION MATERIAL, THERMOELECTRIC CONVERSION MATERIAL, AND PRODUCTION APPARATUS USED IN THE METHOD

(75) Inventors: Toshitada Shimozaki, Fukuoka (JP); Akifumi Nishiwaki, Osaka (JP)

(73) Assignee: KYUSHU INSTITUTE OF TECHNOLOGY, Kitakyushu-shi (JP)

( * ) Notice: Subject to any disclaimer, the term of this patent is extended or adjusted under 35 U.S.C. 154(b) by 177 days.

(21) Appl. No.: 13/807,809

(22) PCT Filed: Jun. 30, 2011

(86) PCT No.: PCT/JP2011/065096
§ 371 (c)(1),
(2), (4) Date: Dec. 31, 2012

(87) PCT Pub. No.: WO2012/002509
PCT Pub. Date: Jan. 5, 2012

(65) Prior Publication Data
US 2013/0101733 A1    Apr. 25, 2013

(30) Foreign Application Priority Data
Jul. 2, 2010    (JP) ................................. 2010-152228

(51) Int. Cl.
*H01L 35/22*    (2006.01)
*C01G 51/00*    (2006.01)
(Continued)

(52) U.S. Cl.
CPC ................. *C01G 51/04* (2013.01); *C01G 45/02* (2013.01); *C01G 45/12* (2013.01);
(Continued)

(58) Field of Classification Search
CPC .... C01G 45/1221; C01G 51/42; C01G 53/40; C01G 51/04; C01G 45/02; C01G 51/40; C01G 45/12; C04B 2235/763; C04B 2235/3275; C04B 35/01; C04B 2235/3201; H01L 35/34; H01L 35/22; C01P 2006/40
USPC ...................................................... 427/126.3
See application file for complete search history.

(56) References Cited

U.S. PATENT DOCUMENTS 4,084,985 A * 4/1978 Evans, Jr. ...................... 136/251
2003/0013596 A1 * 1/2003 Itahara et al. .................. 501/123
(Continued)

FOREIGN PATENT DOCUMENTS

JP    09-321346 A    12/1997
JP    2000-211971 A    8/2000
(Continued)

OTHER PUBLICATIONS

NPL, Y. C. Liou, W. C. Tsai, W. Y. Lin and U. R. Lee "Synthesis of Ca3Co4O9 and CuAlO2 Ceramics of the Thermoelectric Application Using a Reaction-Sintering Process" J. Aust. Ceram. Soc. 44 [1] (2008) 17-22.*
(Continued)

*Primary Examiner* — David Turocy
*Assistant Examiner* — Mohammad Mayy
(74) *Attorney, Agent, or Firm* — Westerman, Hattori, Daniels & Adrian, LLP

(57) ABSTRACT

A method for producing a thermoelectric conversion material composed of a metal A having an alkali metal or alkaline earth metal, a transition metal M, and oxygen O, and represented by $A_xM_yO_z$, where x, y, and z are valences of the respective elements, includes the steps of: using a massive metal oxide as the thermoelectric conversion material and a salt in a solid, liquid or gaseous state; causing a diffusion reaction between the oxide and the salt; and forming the thermoelectric conversion material having aligned crystal orientation. A production apparatus includes a reactor into which the oxide and the salt are introduced, and a heating means for heating the oxide and the salt within the reactor to promote the diffusion reaction. Thereby, the thermoelectric conversion material having efficiency is produced more simply and at lower cost than a production of the single crystal.

1 Claim, 5 Drawing Sheets

(51) Int. Cl.
  *C04B 35/00* (2006.01)
  *H01L 35/34* (2006.01)
  *C01G 51/04* (2006.01)
  *C01G 45/12* (2006.01)
  *C01G 53/00* (2006.01)
  *C04B 35/01* (2006.01)
  *C01G 45/02* (2006.01)

(52) U.S. Cl.
  CPC ............ *C01G 45/1221* (2013.01); *C01G 51/40* (2013.01); *C01G 51/42* (2013.01); *C01G 53/40* (2013.01); *C04B 35/01* (2013.01); *H01L 35/22* (2013.01); *H01L 35/34* (2013.01); *C01P 2002/52* (2013.01); *C01P 2002/72* (2013.01); *C01P 2004/03* (2013.01); *C01P 2006/32* (2013.01); *C01P 2006/40* (2013.01); *C04B 2235/3201* (2013.01); *C04B 2235/3275* (2013.01); *C04B 2235/763* (2013.01)

(56) References Cited

U.S. PATENT DOCUMENTS

2003/0234037 A1* 12/2003 Tanaka .................... H01L 35/32
                                                         136/205
2007/0039641 A1*  2/2007 Hu et al. ........................ 136/238

FOREIGN PATENT DOCUMENTS

| JP | 2002-184403 A | 6/2002 |
|----|---------------|--------|
| JP | 2004-035299 A | 2/2004 |
| JP | 2008-105912 A | 5/2008 |

OTHER PUBLICATIONS

NPL, I. Terasaki, Y. Sasago and K. Uchinokura, "Large thermoelectric power in NaCo2O4 single crystals", Phy Rev B, V 56, 685-687, 1997.*

NPL, Kenji Sugiura, Hiromichi Ohta, Kenji Nomura, Tomohiro Saito, Yuichi Ikuhara, Masahiro Hirano, Hideo Hosono, and Kunihito Koumoto, Thermoelectric Properties of Epitaxial Films of Layered Cobalt Oxides Fabricated by Topotactic Ion-Exchange Methods, Thermoelectrics, 2006. ICT '06. 25th International Conference, IEEE, 2006.*

Mikami, Masashi, et al., "Crystal Growth of Thermoelectric Material NaxCoO2-δ by a Flux Method", The Japan Society of Applied Physics, vol. 41, Jul. 2002, p. L777-L779.

Tajima, Shin, et al., "Thermoelectric properties of highly textured NaCo2O4 ceramics processed by the reactive templated grain growth (RTGG) method", Materials Science and Engineering, B86, Feb. 2001, p. 20-25.

Kanno, Tsutomu, et al., "Anisotropic thermoelectric properties in layered cobaltite AxCoO2 (A=Sr and Ca) thin films", Appl. Phys. Lett., vol. 85, No. 5, 2004, p. 739-741.

Sakai, Akihiro, et al., "Control of Crystalline Orientation in Nano-Block Integrated Layered Cobalt Oxide", Panasonic Technical Journal, vol. 54, No. 3, Oct. 2008, p. 58-60.

International Search Report of PCT/JP2011/065096, mailing date of Aug. 23, 2011.

* cited by examiner

METHOD FOR PRODUCING THERMOELECTRIC CONVERSION MATERIAL, THERMOELECTRIC CONVERSION MATERIAL, AND PRODUCTION APPARATUS USED IN THE METHOD

TECHNICAL FIELD

The present invention relates to a method for producing a thermoelectric conversion material to generate electricity by utilizing waste heat, the thermoelectric conversion material, and a production apparatus used in the method.

BACKGROUND ART

Thermoelectric conversion materials are used for utilization of waste heat by converting waste heat energy to electric energy employing Seebeck effect or Peltier effect.

For example, as described in Patent Literature 1, micro single crystals of such as $NaCo_2O_4$ having a layered perovskite structure have significantly better thermoelectric properties in a-axis direction compared with those of $Bi_2Te_3$ system, which are representatives of conventional metal-based thermoelectric conversion materials. Accordingly, as Patent Literature 2 and Non Patent Literature 1, attempts are made to produce large single crystals of $NaCo_2O_4$, but production of the single crystals usable in thermoelectric generation is difficult and costly and is not achieved.

For this reason, many researchers have attempted to produce polycrystalline bodies of $NaCo_2O_4$ which exhibit high efficiency. However, only significantly lower efficiency compared with that of the single crystals is achieved in a current status. This is because the efficiency of the single crystal in c-axis direction (stacking direction of $NaCo_2O_4$, which is orthogonal to a-axis direction) is about $1/200$ of that in a-axis direction, and polycrystallization brings about only an average efficiency at best. This means that in order to provide polycrystals with higher efficiency, it is necessary to direct all the crystals toward high-efficient direction.

In general, polycrystalline $NaCo_2O_4$ is produced by preparing a mixture of powders of $Na_2CO_3$ and a Co oxide such as $Co_3O_4$, and heating (sintering) the mixture in a temperature range of 880 to 950° C. Here, the powders tend to be micronized so that reaction progresses uniformly and rapidly.

However, such a production method suffers from a drawback that the efficiency of $NaCo_2O_4$ is deteriorated due to other factors besides the anisotropy of crystal orientation, such as cavities caused by gas generated through the reaction, existence of unreacted portions and heterogeneous phases, and weak bonding at grain boundaries. Here, for the purpose of suppression of the other factors such as cavities, methods such as a hot press method and a plasma sintering method is considered and a certain level of achievement is made. However, these methods have no effect on control of the orientation.

For this reason, the efficiency of the polycrystalline thermoelectric conversion materials is extremely poor compared with that of the single crystals.

Moreover, as an attempt to obtain oriented polycrystals, there is a method in which plate-like particles of cobalt hydroxide or cobalt oxide and sodium metal salt are mixed, the mixture is formed in such a way that the plate-like particles are oriented in one direction, and the compact thus obtained is sintered to be densified, thereby producing a sintered body having c-axis direction oriented toward one direction.

In Patent Literature 3 and Non Patent Literature 3 employing this method, control of the orientation toward <001> direction is achieved at a ratio of 90%, which indicates that the efficiency is improved by several times as compared with that of a non-oriented sample.

As research aimed to control the orientation in thin films, for example, in Non Patent Literatures 3 and 4, control of orientation in $Ca_3Co_4O_9$ and $SrCo_4O_9$, which are substances similar to $NaCo_2O_4$, is achieved.

CITATION LIST

Patent Literature

Patent Literature 1: Japanese Unexamined Patent Application Publication No. H09-321346
Patent Literature 2: Japanese Unexamined Patent Application Publication No. 2004-35299
Patent Literature 3: Japanese Unexamined Patent Application Publication No. 2000-211971

Non Patent Literature

Non Patent Literature 1: Masashi Mikami, et al., "Crystal Growth of Thermoelectric Material $Na_xCo\ O_{2-\delta}$ by a Flux Method", The Japan Society of Applied Physics, Vol.41, Jul. 2002, p.L777-L779
Non Patent Literature 2: Shin Tajima, et al., "Thermoelectric properties of highly textured $NaCo_2O_4$ ceramics processed by the reactive templated grain growth (RTGG) method", Materials Science and Engineering, B86, Feb. 2001, p.20-25
Non Patent Literature 3: Tsutomu Kanno, et al., "Anisotropic thermoelectric properties in layered cobaltite $A_xCo\ O_2$ (A=Sr and Ca) thin films", Appl. Phys. Lett., Vol.85, 2004, p.739
Non Patent Literature 4: Akihiro Sakai, et al., "Control of Crystalline Orientation in Nano-Block Integrated Layered Cobalt Oxide", Panasonic Technical Journal, Vol.54No.3, Oct. 2008, p.58-60

SUMMARY OF INVENTION

Technical Problem

The above-described conventional methods, however, have the following drawbacks to be solved.

The method disclosed in Patent Literature 3 and Non Patent Literature 2 comprises steps of generating $NaCo_2O_4$ through a reaction between several micrometers of microscopic flat crystals of, for example, $CO_3O_4$ and $Na_2CO_3$, and finally sintering flat microscopic particles to obtain a bulk form. As a result, disadvantages due to cavities, unreacted portions and heterogeneous phases generated at the time of sintering the microscopic powders, and weak bonding at crystal grain boundaries cannot be overcome. Accordingly, densification of the $NaCo_2O_4$ cannot be achieved, resulting in deterioration of the efficiency (electric conductivity) when the $NaCo_2O_4$ is used as a thermoelectric conversion material.

Moreover, although the method disclosed in Non Patent Literatures 3 and 4 succeeds in control of the orientation in thin films of $Ca_3Co_4O_9$ and $SrCo_4O_9$, which are substances similar to $NaCo_2O_4$, even the preparation of a thin film of $NaCo_2O_4$ is not achieved. Accordingly, a high-efficient thin film of $NaCo_2O_4$ obtained by controlling the orientation is not obtained.

The present invention has been made in view of the above circumstances, and an object thereof is to provide a method for producing a polycrystalline thermoelectric conversion material, the thermoelectric conversion material, and a production apparatus to be used in the method. With the method, the thermoelectric conversion material can be produced more simply and at lower cost as compared with the single crystal and has efficiency close to efficiency of the single crystal.

Solution to Problem

To achieve the above object, the present invention provides a method for producing a thermoelectric conversion material (and a thermoelectric conversion material produced by the method) composed of a metal A including an alkali metal or an alkaline-earth metal, a transition metal M, and oxygen O, the thermoelectric conversion material represented by a general formula: AxMyOz, where x, y, and z are integers determined by valences of respective elements, the method (or the thermoelectric conversion material) comprising: using a massive metal oxide as a solid raw material for the thermoelectric conversion material and a salt in any one of solid, liquid, and gaseous states; and causing a diffusion reaction between the massive metal oxide and the salt.

In the method for producing a thermoelectric conversion material (and the thermoelectric conversion material produced by the method) according to the present invention, it is preferable that the AxMyOz is formed on a substrate.

Here, the substrate is a metal plate, and the AxMyOz can be formed via an insulating film of an oxide of a metal constituting the metal plate.

Alternatively, the substrate may be a ceramic plate, and after formation of a metal film on the ceramic plate by one of deposition and plating, the metal film may be oxidized to produce the massive metal oxide.

Here, it is preferable that the massive metal oxide is a cobalt oxide, the salt is a sodium salt, the metal A is sodium, the transition metal M is cobalt, and the AxMyOz is $NaCo_2O_4$.

Alternatively, the massive metal oxide may be a manganese oxide, the salt may be a calcium salt, the metal A may be calcium, the transition metal M may be manganese, and the AxMyOz may be $CaMnO_3$.

Further alternatively, the massive metal oxide may be a cobalt oxide, the salt may be a calcium salt, the metal A may be calcium, the transition metal M may be cobalt, and the AxMyOz may be either one of $Ca_3Co_4O_9$ and $Ca_2Co_2O_5$.

The present invention provides a production apparatus used in the method, comprising a reactor into which the massive metal oxide and the salt are charged, and a heating means for heating the massive metal oxide and the salt in the reactor to promote the diffusion reaction.

Advantageous Effects of Invention

With the method for producing a thermoelectric conversion material according to the present invention and the thermoelectric conversion material produced by the method, the thermoelectric conversion material having aligned crystal orientation can be produced by causing the diffusion reaction between the massive metal oxide, which is a solid raw material of the thermoelectric conversion material, and the salt. This is because, for alloys having anisotropy in the crystal orientation, generally, crystals grow in a direction to which the diffusion progresses rapidly (the diffusion progresses easily), and a diffusion layer having columnar crystal boundaries is formed.

Thereby, it is possible to produce the densified thermoelectric conversion material having aligned crystal orientation and with extremely fewer cavities and defects as compared with materials obtained by the conventional methods.

Moreover, the use of the massive metal oxide and employment of the diffusion reaction suppresses and further prevents generation of cavities, unreacted portions, and heterogeneous phases, thereby allowing the diffusion layer to have a densified structure. Thereby, it is possible to produce a polycrystalline thermoelectric conversion material, having efficiency close to efficiency of the single crystal, more simply and at lower cost as compared with the single crystal.

When the substrate consists of the metal plate and the AxMyOz is formed on the substrate, the fragile AxMyOz can be reinforced by the metal plate while direct contact between the metal plate and the AxMyOz can be prevented (insulated) by the insulating film that is the oxide of the metal constituting the metal plate.

Furthermore, when the substrate consists of the ceramic plate (e.g., alumina plate) and the AxMyOz is formed on the substrate, the AxMyOz may also be produced by a method such as deposition or plating. Specifically, the AxMyOz may be produced by generating a metal film with a thickness of several micrometers to several millimeters on, e.g., the alumina plate, immersing the alumina, plate directly into sodium carbonate (salt), and oxidizing the metal film (equivalent to the massive metal oxide). Alternatively, the AxMyOz may also be formed by oxidizing the metal film formed on the alumina plate beforehand, and reacting the oxidized metal film with the sodium carbonate (salt).

A thermoelectric generation element is fabricated by combining a P-type semiconductor and an N-type semiconductor, which are thermoelectric conversion materials. In this case, since electricity generated by a single pair of PN junction is small, it is necessary to connect many pairs in series. In many cases, thermoelectric conversion materials are connected by metal electrodes. However, for example, $NaCo_2O_4$ and $CoO$ are susceptible to be damaged when connected because of their brittleness.

Thus, by forming the AxMyOz on the metal plate or on the ceramic plate via the insulating film, damage of the thermoelectric material is suppressed. As a result, it is possible to produce the polycrystalline thermoelectric conversion material more simply and at lower cost as compared with the single crystal.

Particularly when the AxMyOz is $NaCo_2O_4$, advantageous effect of the present invention is eminent because the thermoelectric properties of the $NaCo_2O_4$ are extremely better compared with those of $Bi_2Te_3$ system, which are representatives of the conventional metal-based thermoelectric conversion materials.

Moreover, when the production apparatus used in the method for producing a thermoelectric conversion material comprises the reactor into which the massive metal oxide and the salt is charged, and a heating means for heating the massive metal oxide and the salt in the reactor to promote the diffusion reaction, the thermoelectric conversion material can be produced by a simple apparatus configuration. Thereby, the polycrystalline thermoelectric conversion material can be produced more simply and at lower cost compared with the single crystal.

DESCRIPTION OF EMBODIMENT

A preferred embodiment of the present invention will be described with reference to the accompanying drawings for a better understanding of the present invention.

Figure 1:
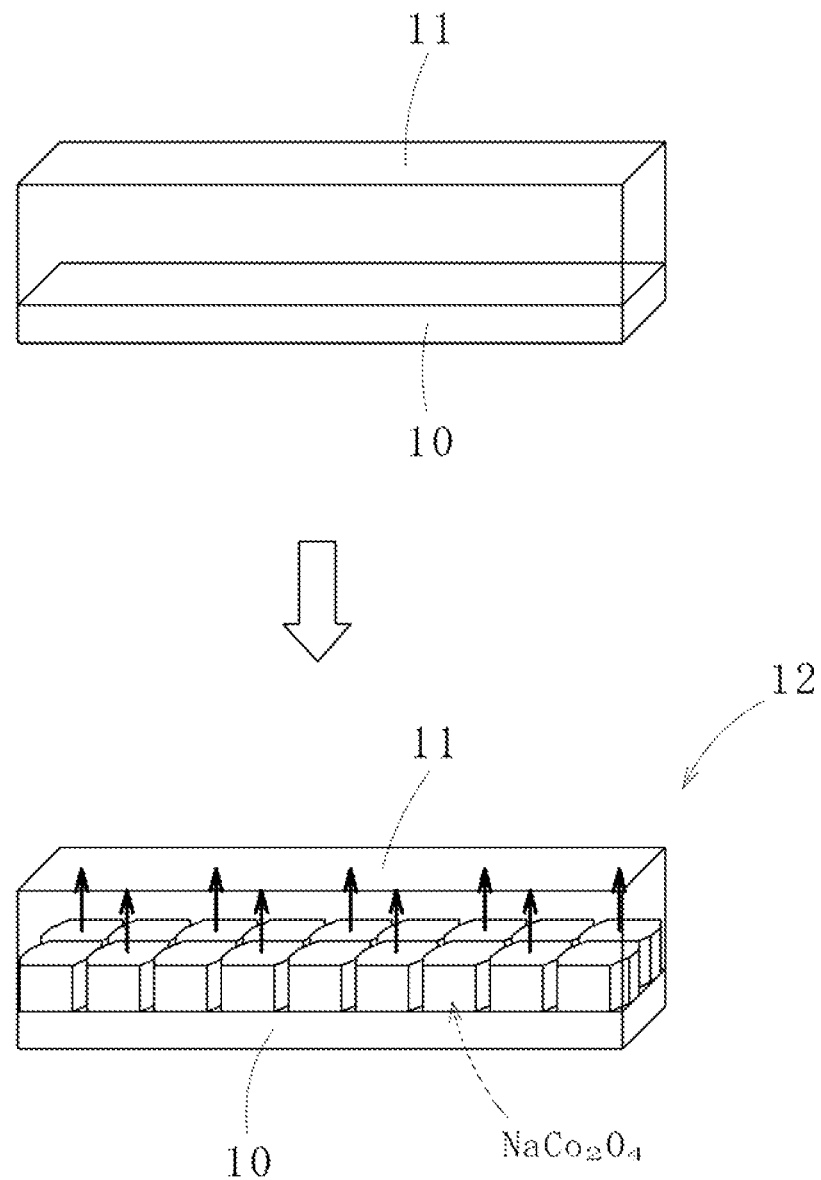
FIG. 1 is an explanatory diagram illustrating a method for producing a thermoelectric conversion material according to one embodiment of the present invention.

As illustrated in FIG. 1, a method for producing a thermoelectric conversion material according to one embodiment of the present invention is a method for producing a thermoelectric conversion material (P-type semiconductor) represented by $NaCo_2O_4$ (an example of $A_xM_yO_z$) composed of sodium (an example of a metal A), cobalt (an example of a transition metal M), and oxygen O. The method includes a diffusion reaction between a cobalt oxide (an example of a massive metal oxide) 10, which is a solid raw material for the thermoelectric conversion material, and sodium carbonate (an example of a sodium salt) 11, thereby forming the thermoelectric conversion material having aligned crystal orientation. In FIG. 1, the numeral 12 represents an intermediate formed in a formation process of the thermoelectric conversion material. Further description will be made hereunder.

The thermoelectric conversion material produced is $NaCo_2O_4$. However, the thermoelectric conversion material obtained by the present invention is not limited to $NaCo_2O_4$. For example, the present invention includes $Ca_3Co_4O_9$ and $Ca_2Co_2O_5$ composed of calcium (an example of the metal A), cobalt (an example of the transition metal M), and oxygen O. The present invention also includes a thermoelectric conversion material (N-type semiconductor) represented by $CaMnO_3$, composed of calcium (an example of the metal A), manganese (an example of the transition metal. M), and oxygen O.

Furthermore, the present invention includes a thermoelectric conversion material composed of metal A composed of an alkali metal or an alkaline-earth metal as described below, transition metal M, and oxygen O. The thermoelectric conversion material is represented by a general formula: $A_xM_yO_z$, where x, y, and z are integers determined by valences of the respective elements.

The alkali metal as the metal A includes, for example, lithium (Li), sodium, potassium (K), rubidium (Rb), and cesium (Cs). The alkaline-earth metal includes, for example, magnesium (Mg), calcium (Ca), strontium (Sr), and barium (Ba).

The transition metal (transition element) M includes, for example, titanium (Ti), vanadium (V), chromium (Cr), manganese (Mn), iron (Fe), cobalt, nickel (Ni), copper (Cu), aluminum (Al), germanium (Ge), arsenic (As), yttrium (Y), zirconium (Zr), molybdenum (Mo), cadmium (Cd)), indium (In), tin (Sn), tantalum (Ta), and tungsten (W).

When producing the above-mentioned $NaCo_2O_4$, first, the cobalt oxide 10 (cobalt oxide: CoO, $Co_3O_4$, etc.) is prepared.

The cobalt oxide usable is not in a form of powder, but in a form of a plate (plate material) having a thickness of, e.g., 0.1 to 5 mm. The thickness and shape, however, can be varied according to the purpose of use. For example, a film having a thickness of several micrometers to several millimeters may also be used. The cobalt oxide can be obtained by heating and oxidizing a cobalt plate, but not limited to this. A thin plate of a cobalt oxide produced beforehand may also be used. When producing $CaMnO_3$, a manganese oxide (manganese dioxide: $MnO_2$) is prepared.

Subsequently, the cobalt oxide 10 is brought into contact with the sodium carbonate ($Na_2CO_3$) 11, which is a carbonate having sodium as cation (an example of oxysalts).

As a salt to be brought into contact with the cobalt oxide, any one or more kinds of hydroxides, other oxysalts, and halogenides having sodium as cation may be used. Examples of other oxysalts include nitrate (sodium nitrate: $NaNO_3$), nitrite, sulfate, and phosphate. Examples of halogenides include chloride (sodium chloride: NaCl), fluoride, bromide, and iodide.

Moreover, the salt used may be any one or more kinds of hydroxides, oxysalts, and halogenides having an alkali metal or an alkaline-earth metal as cation, according to the kind of the metal A constituting the thermoelectric conversion material. In the cases of $Ca_3Co_4O_9$, $Ca_2Co_2O_5$, and $CaMnO_3$, calcium salts such as calcium carbonate ($CaCO_3$), calcium chloride ($CaCl_2$), and calcium nitrate ($Ca(No_3)_2$) can be used.

Figure 2A:
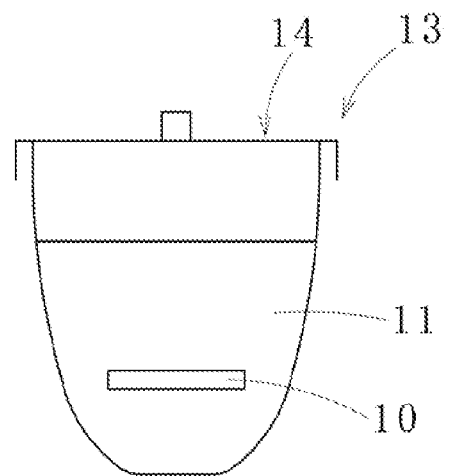
FIGS. 2 (A) and 2 (B) are an explanatory diagram illustrating a production apparatus used in the method for producing a thermoelectric conversion material, and a graph showing a temperature increase pattern applied to FIG. 2 (A), respectively.
Figure 2B:
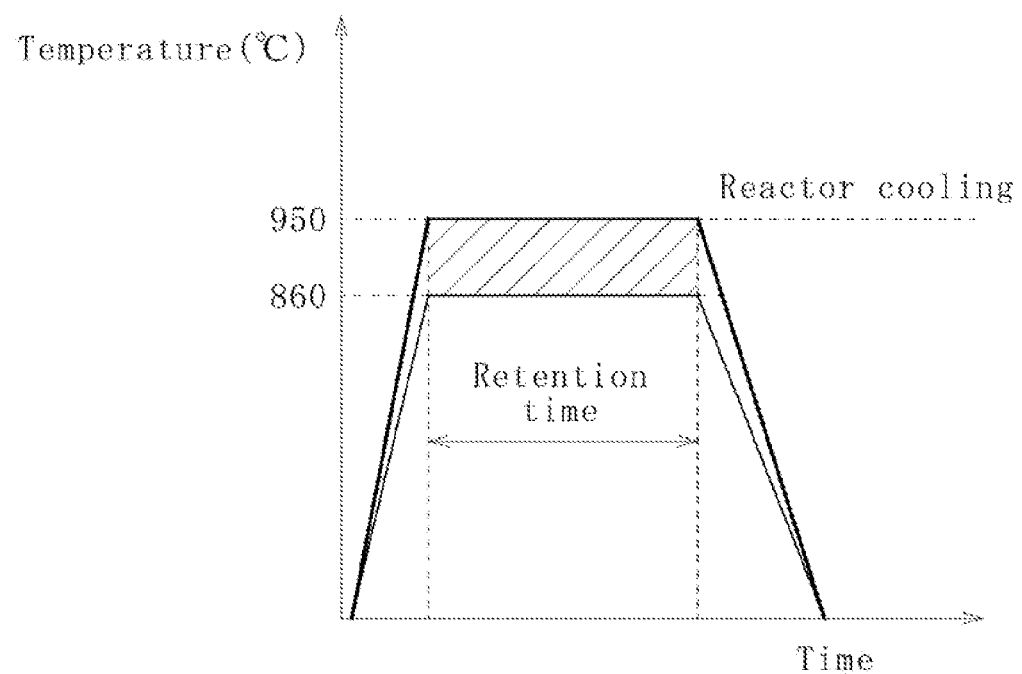

Here, the contact between the cobalt oxide 10 and the sodium carbonate 11 is carried out by a production apparatus of the thermoelectric conversion material (hereafter, also simply referred to as production apparatus) 13 illustrated in FIG. 2 (A). The production apparatus 13 comprises a reactor 14 into which the cobalt oxide 10 and the sodium carbonate 11 are charged, and a heating means (not illustrated) for heating the cobalt oxide 10 and the sodium carbonate 11 in the reactor 14. As the reactor, a lidded pot (made of alumina) may be used, but it is not limited to this, and any can be used as long as it is capable of enclosing the cobalt oxide and the sodium carbonate. As the heating means, an electric furnace or the like may be used, but it is not limited to this, and any heating means may be used as long as it is capable of heating the cobalt oxide and the sodium carbonate in the reactor to promote diffusion reaction.

A mass ratio of the sodium carbonate to the cobalt oxide charged into the reactor is preferably determined such that a mass of the sodium carbonate is, for example, 0.5 times or more and 10 times or less of a mass of the cobalt oxide (more preferably, the lower limit is 1 times).

When the mass of the sodium carbonate is less than 0.5 times the mass of the cobalt oxide, an amount of the sodium carbonate with respect to an amount of the cobalt oxide is too small. Therefore, supply of Na required for growth of the $NaCo_2O_4$ is cut off, which stops the growth of the $NaCo_2O_4$, and full growth of the $NaCo_2O_4$ cannot be achieved.

Meanwhile, when the mass of the sodium carbonate is more than 10 times of the mass of the cobalt oxide, an amount of the sodium carbonate with respect to an amount of the cobalt oxide is too large. Therefore, much time is required for forming and growing the $NaCo_2O_4$.

As described above, by heating the cobalt oxide 10 and the sodium carbonate 11 charged into the reactor 14 by the heating means, the sodium carbonate 11 is transformed to a liquid state (molten salt). Alternatively, the cobalt oxide may be placed into a liquefied sodium carbonate.

Here, a heating temperature is in a temperature range where the $NaCo_2O_4$ can stably exist, and preferably higher than a melting point of the sodium carbonate (851° C.). Specifically, the heating temperature is determined in a range of 860 to 950° C. (a shaded area in FIG. 2 (B)). The heating temperature may be varied within the temperature range where the $NaCo_2O_4$ can stably exist, according to the kind of the salt used. When the heating temperature is in the temperature range where the $NaCo_2O_4$ can stably exist and when the $NaCo_2O_4$ is under a condition that enables the growth of the $NaCo_2O_4$, the growth generally tends to be faster at a higher temperature.

Through the above process, as illustrated in FIG. 1, the sodium carbonate 11 is brought into contact with a surface of the cobalt oxide 10, thereby forming a single phase of the $NaCo_2O_4$ on one side of the cobalt oxide that is in contact with the sodium carbonate through the reaction between the cobalt oxide 10 and the sodium carbonate 11.

Retention time of the above-described heating temperature (i.e., time required for diffusion) is from 10 to 200 hours, but not limited to this. The retention time can be varied according to a thickness of the $NaCo_2O_4$ formed.

In the molten sodium carbonate to be brought into contact with the cobalt oxide, cobalt monoxide (CoO) may be dissolved (including saturation) beforehand. By dissolving cobalt monoxide in the molten sodium carbonate beforehand, redissolution of the once-formed $NaCo_2O_4$ into the sodium carbonate is inhibited and moreover prevented when the sodium carbonate is brought into contact with the cobalt oxide. Accordingly, in this case, the mass of the sodium carbonate may exceed the above-mentioned upper limit (i.e., 10 times of the mass of the cobalt oxide), and may be increased to about 100 times of the mass of the cobalt oxide.

Thereby, formation time of the $NaCo_2O_4$ can be further shortened. The sodium carbonate, in which a certain amount of cobalt monoxide is dissolved, can be made by heating a prescribed amount of powders (or grains) of sodium carbonate and cobalt monoxide charged into, for example, an alumina-made pot in a temperature range of 860 to 950° C.

The sodium carbonate may be transformed into a gaseous state (vapor) before being brought into contact with the cobalt oxide.

For example, by heating the cobalt oxide and the sodium carbonate in a range of 860 to 950° C. and 900 to 1100° C., respectively, vapor of the sodium carbonate or sodium monoxide is dispersed toward the cobalt oxide and reacts with the cobalt oxide, thereby forming a single phase of $NaCo_2O_4$.

As the salt, a salt other than sodium carbonate may be used, and in this case, the heating temperature of the salt can be varied according to the kind of the salt used.

Further, sodium carbonate remaining in a solid state may be brought into contact with the cobalt oxide.

In this case, by heating the cobalt oxide and the sodium carbonate in a temperature range (e.g., from 800 to 850° C.) where both of the cobalt oxide and the sodium carbonate do not melt, a single phase of $NaCo_2O_4$ can be formed through reaction between the cobalt oxide and the sodium carbonate.

The heating temperature may be varied according to the kinds of the massive metal oxide and the salt used. For example, the heating temperature is determined within a temperature range that is 5 to 150° C. (preferably, a lower limit is 10° C. and an upper limit is 100° C.) lower than a melting point of the massive metal oxide or of the salt, whichever is lower.

Since the above-mentioned $NaCo_2O_4$ is fragile, the $NaCo_2O_4$ may be formed on a cobalt plate, which is a metal plate (an example of a substrate), via an insulating film of cobalt monoxide (CoO: an example of an oxide of a metal constituting the metal plate) so as to be reinforced.

As this method, it is preferable that the cobalt plate is prepared and heated to form cobalt monoxide such that cobalt remains, and then the $NaCo_2O_4$ is formed while keeping a part of the cobalt monoxide. In order to optimize a remaining thickness of the cobalt plate, a remaining film thickness of the cobalt monoxide, and a thickness of the $NaCo_2O_4$ formed, an initial thickness of the cobalt plate and an initial film thickness of the cobalt monoxide can be selected based on research on formation and growth process of the cobalt monoxide during oxidization of the cobalt plate and the $NaCo_2O_4$ during the reaction between the cobalt monoxide and the sodium carbonate at various heating temperatures and time (based on historical data from the past).

For example, the remaining thickness of the cobalt plate after the formation of the $NaCo_2O_4$ is 0.5 to 1 mm, the remaining film thickness of the cobalt monoxide after the formation of the $NaCo_2O_4$ is 0.01 to 0.5 mm, and the thickness of the $NaCo_2O_4$ formed is 50 µm to 2 mm.

The above-mentioned thicknesses may be varied according to the purpose of use. Furthermore, the above-mentioned $NaCo_2O_4$ may be formed on a ceramic plate or the likes instead of the metal plate. In this case, after formation of a Co film (an example of a metal film) on the ceramic plate by deposition or plating, the Co film is oxidized to produce the cobalt oxide (massive metal oxide), and the $NaCo_2O_4$ is formed by the above-described method. The cobalt oxide can be totally used for production of $NaCo_2O_4$, but a part of the cobalt oxide may be left as an insulating film, for example.

A method of forming the metal film is not limited to deposition and plating, and any method capable of forming the metal film on the ceramic plate may be employed.

Moreover, the above-mentioned substrate for reinforcing the $NaCo_2O_4$ is not limited to the metal plate and the ceramic plate, but a substrate made of another material may be used as long as the substrate is capable of reinforcing the $NaCo_2O_4$.

As described above, by using the diffusion reaction, the crystal orientation of the $NaCo_2O_4$ produced can be aligned to one direction of c-axis direction (diffusion direction). Here, "aligned to one direction" does not necessarily mean that all the crystal orientation is perfectly aligned to the same direction, but includes cases where 70% (preferably 80%, and still preferably 90%) or more by area ratio of the crystal orientation in the formed $NaCo_2O_4$ inclines within a range of ±45 degrees (preferably ±30 degrees) with respect to the c-axis direction, for example.

As described above, by employing the diffusion reaction, the polycrystalline $NaCo_2O_4$ having efficiency close to efficiency of the single crystal can be produced more simply and at lower cost compared with the single crystal.

Accordingly, a PN junction is enabled using the $NaCo_2O_4$ as a P-type semiconductor and, for example, ZnO or $CaMnO_3$ as an N-type semiconductor, which can be utilized as a thermoelectric conversion element. Particularly when $CaMnO_3$ is produced by the method according the present invention, the $CaMnO_3$ can be produced together with the P-type $NaCo_2O_4$, which significantly simplifies production process.

EXAMPLE

An experimental example conducted to confirm the effect of the present invention will be described.

Figure 3:
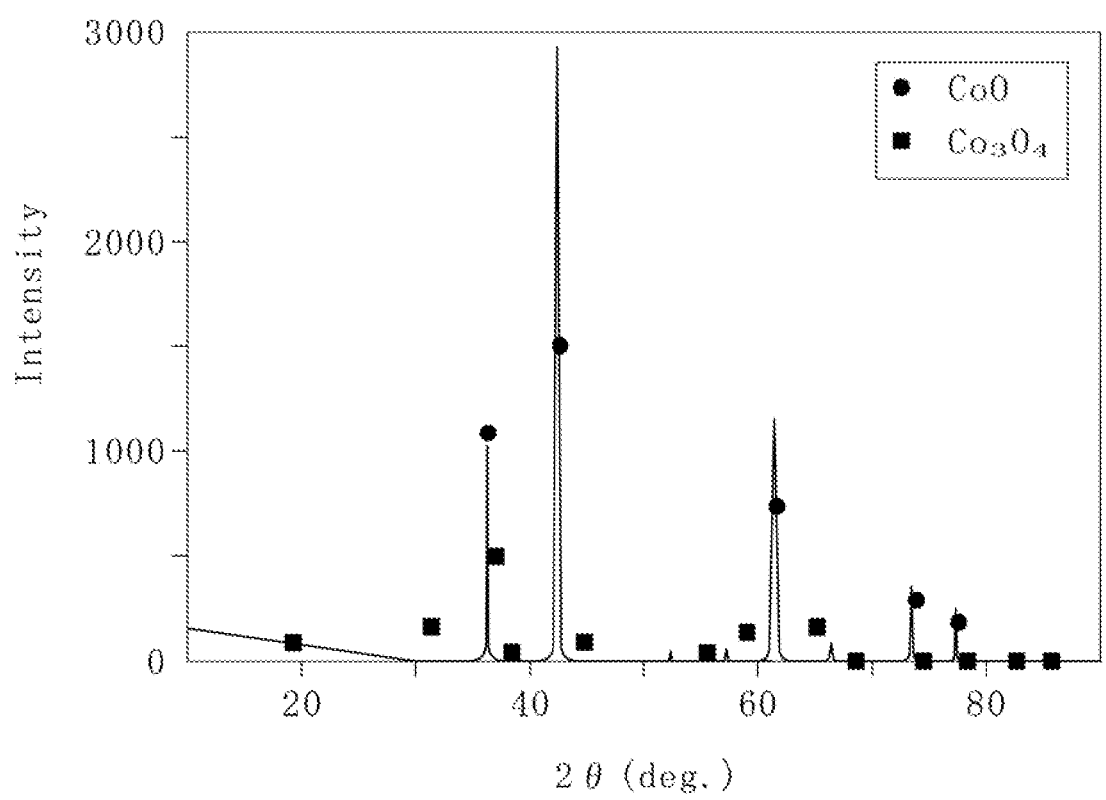
FIG. 3 is a graph showing an X-ray diffraction result of an oxide film formed by burning a cobalt plate.

First, a Co plate having a purity of 99.5 mass % was heated at 1100° C. for 72 hours to be oxidized. Among cobalt oxides, $Co_3O_4$ is stable at room temperature. However, from an X-ray diffraction result shown in FIG. 3, it was confirmed that CoO was formed.

Next, the produced CoO plate (0.6 g) was placed on an alumina-made square plate, and an upper surface of the CoO plate was covered with $Na_2CO_3$ (0.5 g), and then heated at 860° C. for 24 hours in the atmosphere. At this temperature, the $Na_2Co_3$ was melted and in a liquid state.

Figure 4:
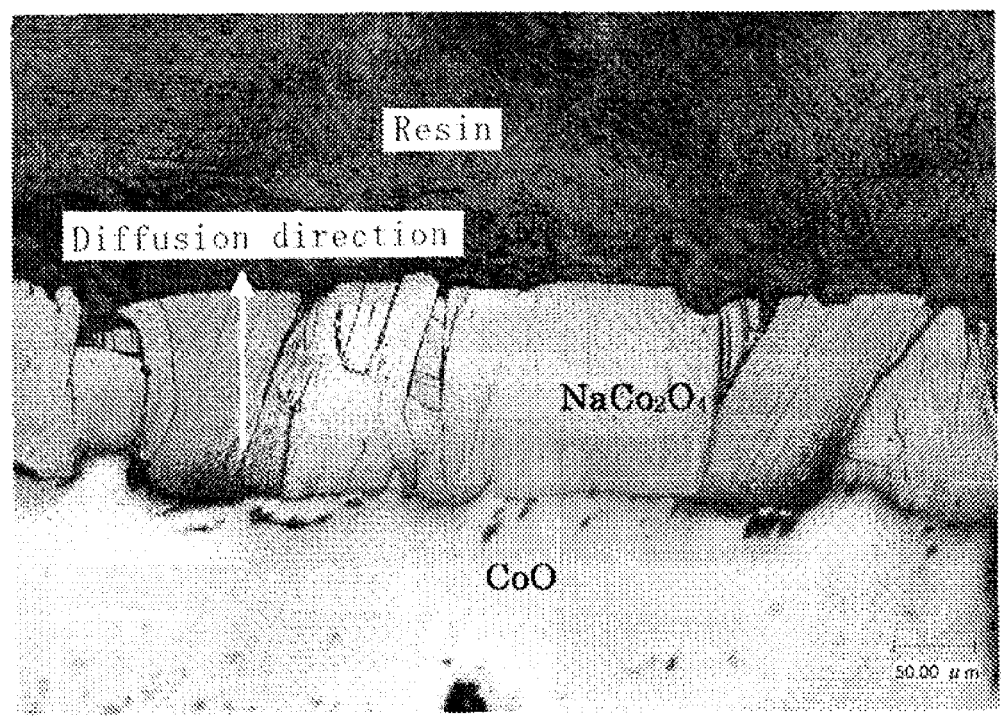
FIG. 4 is a photograph showing a metallographic structure of a section of the thermoelectric conversion material produced.

As a result, by reaction between the CoO plate and the $Na_2CO_3$, $NaCo_2O_4$ was formed as a single phase through diffusion reaction as shown in FIG. 4. Moreover, the $NaCo_2O_4$ was formed between the CoO and the $Na_2CO_3$ (resin in FIG. 4), crystal grain boundaries were formed in a perpendicular direction with respect to a joining surface between the CoO and the $Na_2CO_3$, and columnar crystals of the $NaCo_2O_4$ were formed. In FIG. 4, resin existed instead of the $Na_2CO_3$, because a sample was washed with water. FIG. 4 is a photograph showing a microscopic structure of the $NaCo_2O_4$ formed by the method of the present invention. The crystal grain boundaries of the $NaCo_2O_4$ observed between the lower CoO and the upper resin were almost parallel to the diffusion direction, while defects such as cavities and inclusions were not observed. The crystal grain boundaries being almost parallel to the diffusion direction indicated that crystal orientation was aligned in a particular direction, and the crystal orientation was aligned in c-axis direction as shown by an X-ray diffraction result described below.

Figure 5:
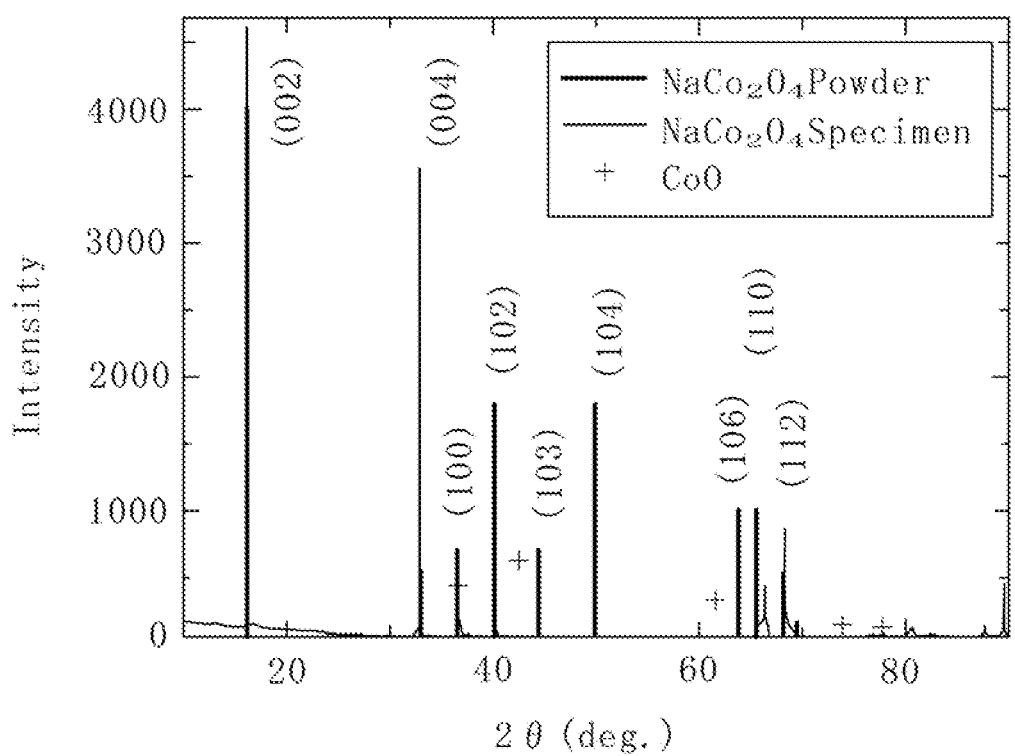
FIG. 5 is a graph showing an X-ray diffraction result of the thermoelectric conversion material.

With reference to FIG. 5, the X-ray diffraction result of a surface where a layer formed through the diffusion reaction exists will be described. As shown in FIG. 5, diffraction peaks of the $NaCo_2O_4$ were obtained, and diffraction peak intensity was especially intense in <001> direction. This indicates that <001> orientation of the $NaCo_2O_4$ was aligned in one direction toward diffusion direction (c-axis direction). Observing FIG. 4 while focusing on this point, the crystal grain boundaries of the $NaCo_2O_4$ were aligned parallel to the diffusion direction (perpendicular to a CoO plane) FIG. 5 shows that the thermoelectric conversion material produced by the method of the present invention had the aligned crystal orientation. As shown in FIG. 5, diffraction peaks of $NaCo_2O_4$ powder shown with a thick solid line were observed at, for example, <102> and <104>. On the other hand, these peaks were not observed in a specimen produced by the method of the present invention shown with a thin solid line, which indicated that the crystal orientation was aligned in the c-axis direction of <002> and <004>.

In view of the above, by employing the method for producing the thermoelectric conversion material of the present invention, it is possible to produce a polycrystalline thermoelectric conversion material having the efficiency close to efficiency of the single crystal more simply and at lower cost compared with the single crystal.

Although the present invention has been described with reference to the embodiment, the present invention is not limited to the construction described in the embodiment, and various embodiments and modifications can be made within the scope of the claims. The scope of the present invention includes, for example, cases where a part of or all of the above embodiments and modifications are combined to configure the method for producing the thermoelectric conversion material, the thermoelectric conversion material, and the production apparatus used in the method.

REFERENCE SIGNS LIST

10: cobalt oxide (massive metal oxide), 11: sodium carbonate (salt), 12: intermediate, 13: production apparatus of a thermoelectric conversion material, 14: reactor

The invention claimed is:

1. A method for producing a polycrystalline thermoelectric conversion material composed of sodium which is an alkali metal, cobalt, and oxygen, and represented by $NaCo_2O_4$, comprising:
    using a cobalt oxide of 0.1 to 5 mm in thickness and in a form of a plate as a solid raw material for the $NaCo_2O_4$ and sodium carbonate in any one of solid, liquid, and gaseous states; and
    causing a diffusion reaction between the cobalt oxide and the sodium carbonate.

* * * * *